(12) United States Patent
Matsui et al.

(10) Patent No.: US 6,917,143 B2
(45) Date of Patent: Jul. 12, 2005

(54) LIGHTING APPARATUS WITH ENHANCED CAPABILITY OF REMOVING HEAT

(75) Inventors: Nobuyuki Matsui, Takatsuki (JP); Hideo Nagai, Takatsuki (JP); Tetsushi Tamura, Takatsuki (JP); Kenzo Hatada, Katano (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 103 days.

(21) Appl. No.: 10/243,483

(22) Filed: Sep. 13, 2002

(65) Prior Publication Data

US 2003/0052584 A1 Mar. 20, 2003

(30) Foreign Application Priority Data

Sep. 17, 2001 (JP) ........................................ 2001-282246

(51) Int. Cl.[7] ................................................. H01J 33/00
(52) U.S. Cl. ............................. 313/35; 313/36; 313/46; 313/11; 313/12; 313/22; 313/24
(58) Field of Search ............................... 313/11, 12, 22, 313/24, 35, 36, 46, 511, 498, 499, 506, 512, 510

(56) References Cited

U.S. PATENT DOCUMENTS

| 4,905,021 | A | * | 2/1990 | Iizuka et al. ................. 347/237 |
| 5,857,767 | A | * | 1/1999 | Hochstein .................... 362/294 |
| 5,869,919 | A | * | 2/1999 | Sato et al. .................... 313/17 |
| 6,586,721 | B2 | * | 7/2003 | Estevez-Garcia ............ 257/81 |
| 6,670,751 | B2 | * | 12/2003 | Song et al. .................. 313/512 |

FOREIGN PATENT DOCUMENTS

| JP | 08-179836 | * | 2/2001 | ............ H04N/5/64 |
| JP | 2001036148 | | 2/2001 | |
| JP | 2001284659 | | 10/2001 | |

* cited by examiner

*Primary Examiner*—Nimeshkumar D. Patel
*Assistant Examiner*—Sharlene Leurig

(57) ABSTRACT

A lighting apparatus comprises an LED-mounted substrate and an exhauster. The substrate has a flat area as well as one or more raised areas of trapezoidal cross section which each form a passage thereunder. LEDs are mounted on the raised areas. When the LED-mounted substrate is installed on a wall, the passages are enclosed by the wall. The exhauster removes the heat from the LEDs by drawing out the air going through inside the passages.

19 Claims, 11 Drawing Sheets

LIGHTING APPARATUS WITH ENHANCED CAPABILITY OF REMOVING HEAT

This application is based on an application No. 2001-282246 filed in Japan, the content of which is hereby incorporated by reference.

BACKGROUND OF THE INVENTION (1) Field of the Invention

The present invention relates to lighting apparatuses mainly with LEDs (Light Emitting Diodes), and more particularly heat removing methods for such lighting apparatuses.

(2) Description of the Related Art

Lately, lighting apparatuses with LEDs have been attracting attention as next-generation lighting apparatuses to take over fluorescent lamps and the like. The lighting apparatuses with LEDs have advantages in compactness and a long life span over incandescent lamps, fluorescent lamps and mercury lamps.

LEDs, however, do not have very high luminous efficacy presently and a large part of electricity supplied to LEDs turns into heat. There are problems that the heat reduces the quantity of light from the LEDs, or in a worst case, the heat damages the LEDs.

In order to solve the problems, there is an idea to install a heat sink on the back of a substrate on which LEDs are mounted; however, with this idea one of the benefits of the LED lighting apparatuses of being compact would be lost, because a cooling member needs to be installed as well as another device for dissipating the heat conducted to the cooling member.

SUMMARY OF THE INVENTION

In view of the stated problems, it is an object of the present invention to provide a lighting apparatus with high efficiency of heat dissipation without increasing its size by adding another cooling member such as a cooling board.

In order to achieve the stated object, the present invention presents a lighting apparatus comprising a substrate and light emitting bodies mounted on a main surface of the substrate, wherein one or more areas of the substrate are raised to each form a passage thereunder through which a fluid flows to remove heat from the light emitting bodies, and the light emitting bodies are mounted on the raised areas.

With this arrangement, it is possible to remove the heat from a lighting apparatus by having the fluid flow in the passage to efficiently conduct the heat from the luminous elements (e.g. LEDs) mounted on a substrate. Furthermore, it is possible to avoid increasing the size or weight of the lighting apparatus, because the lighting apparatus of the present invention does not require a cooling member such as a radiator board nor space for dissipating the heat from the radiator board into the air.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following describes preferred embodiments of a lighting apparatus in the present invention with reference to the drawings:

First Embodiment

[1] General Structure

Figure 1:
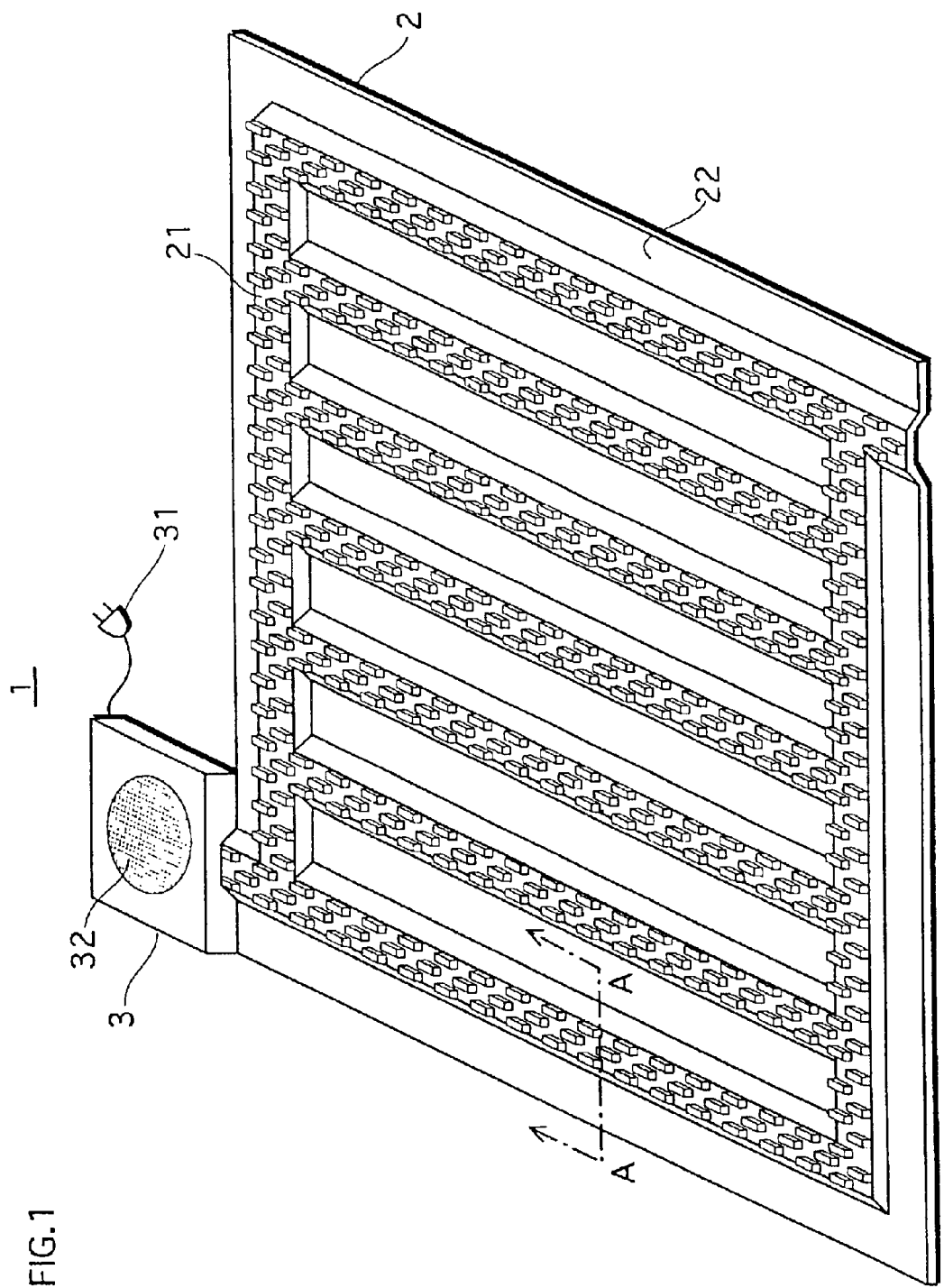
FIG. 1 is a perspective view of the lighting apparatus 1 in the first embodiment of the present invention as seen by looking down on the exterior thereof.

The following describes the general structure of the lighting apparatus of the first embodiment with reference to FIG. 1. FIG. 1 is a perspective view of the lighting apparatus as seen by looking down on its exterior. The lighting apparatus 1 comprises an LED-mounted substrate 2 and an exhauster 3. The LED-mounted substrate 2 has a raised area 21 of trapezoidal cross section, and a flat area 22. A large number of LEDs are mounted on the raised area 21 of the LED-mounted substrate 2.

Figure 2:
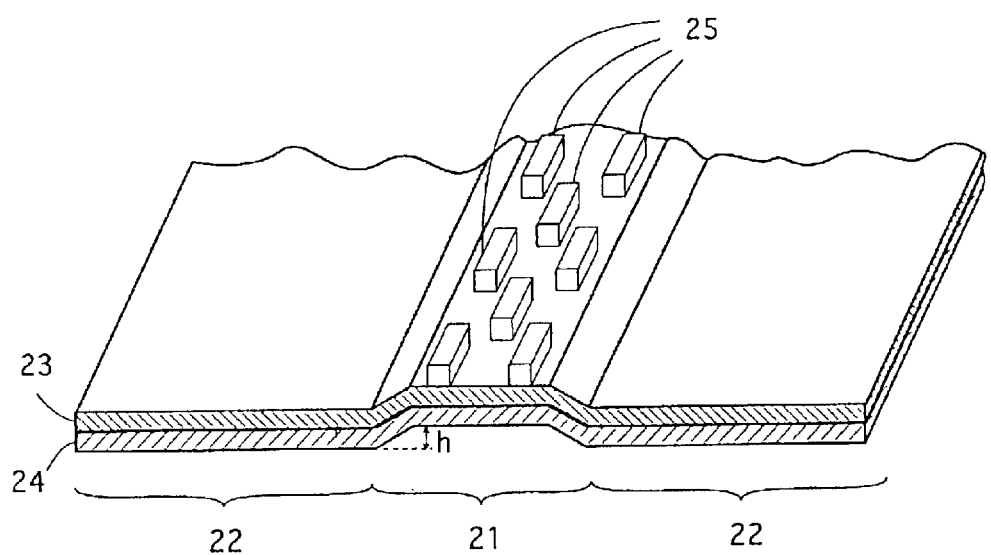
FIG. 2 is a perspective sectional view from the cross section A—A, near the raised area 21 of the LED-mounted substrate 2.

FIG. 2 is a perspective sectional view of the raised area 21 from the cross section A—A. The LED-mounted substrate 2 is made up of a flexible substrate 24 with the Cu pattern 23 formed thereon. The flexible substrate 24 is made of glass epoxy (glass fiber reinforced plastic). The height h of the raised area 21 measured from the level of the flat area 22 is arranged so that h is equal to or larger than a half of the thickness of the flexible substrate 24. And, SMD (Surface Mounted Device)-type LEDs 25 are mounted on the raised area 21. Hereafter the surface of the substrate on which the LEDs are mounted is referred to as the top, and the opposite surface is referred to as the bottom.

Figure 3:
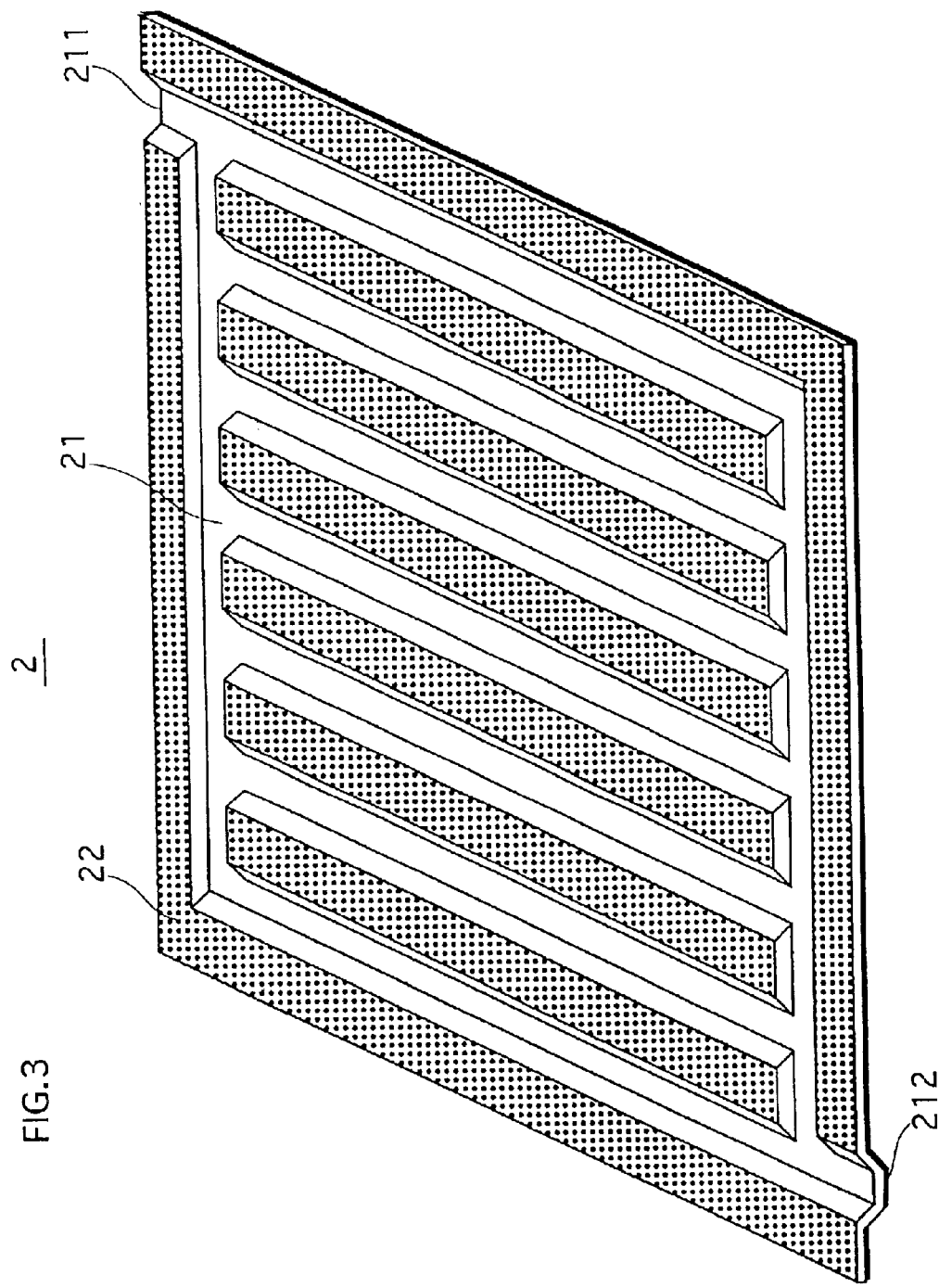
FIG. 3 is a perspective view of the exterior of the LED-mounted substrate 2 from the bottom.

The raised area 21 on the top of the LED-mounted substrate 2 is seen as a depression when viewed from the bottom. FIG. 3 is a perspective view of the exterior of the LED-mounted substrate 2 from the bottom. In FIG. 3, the flat area 22 is shaded. The LED-mounted substrate 2 is designed to be attached on a wall or a ceiling with an adhesive applied to the flat area 22. The depression, which is unshaded in the drawing, is on the back of the raised area 21.

When the LED-mounted substrate 2 is attached on a wall, there will be some space enclosed by the raised area 21 and the wall because of the difference of the levels between the raised area 21 and the flat area 22. There are an opening 211 and an opening 212 on the two ends of the raised area 21, and an exhauster 3 is connected to the opening 211 as shown in FIG. 1. The exhauster 3 draws out the air inside the passage, which is the space enclosed by the raised area 21 and the wall. The air in the passage is the medium to remove the heat from the LEDs.

The exhauster 3 includes an opening connected to the LED-mounted substrate 2 for drawing out the air, and two terminals: one for a ground, and the other for supplying electricity to the LED-mounted substrate 2. Inside the exhauster 3 is a small-sized fan driven by a small-sized motor, and the air comes out of an air vent 32 on the top surface of the exhauster 3. The air vent 32 is covered with a filter so that foreign substances do not enter.

On the side of the exhauster 3 is a power line 31 with a plug for getting the external electricity supply. The exhauster 3 is supplied with alternating-current electricity from a commercial power supply via the power line 31, and converts the alternating-current electricity to direct-current electricity at a rated voltage by an AD converter (not shown in the drawing). The direct-current electricity is used to drive the small-sized motor as well as to light the LEDs as it is supplied to the LED-mounted substrate 2.

When the exhauster 3 starts to draw out and exhaust the air, the air inside the passage has decompression. As a result, new unheated air comes in from the opening 212 and goes through the passage before it gets exhausted from the air vent 32 of the exhauster 3. This way, the raised area 21 heated by the LEDs mounted on its top gets cooled by the air going through the passage, and as a result, the LED-mounted substrate 2 including the LEDs gets cooled as well.

Figure 4:
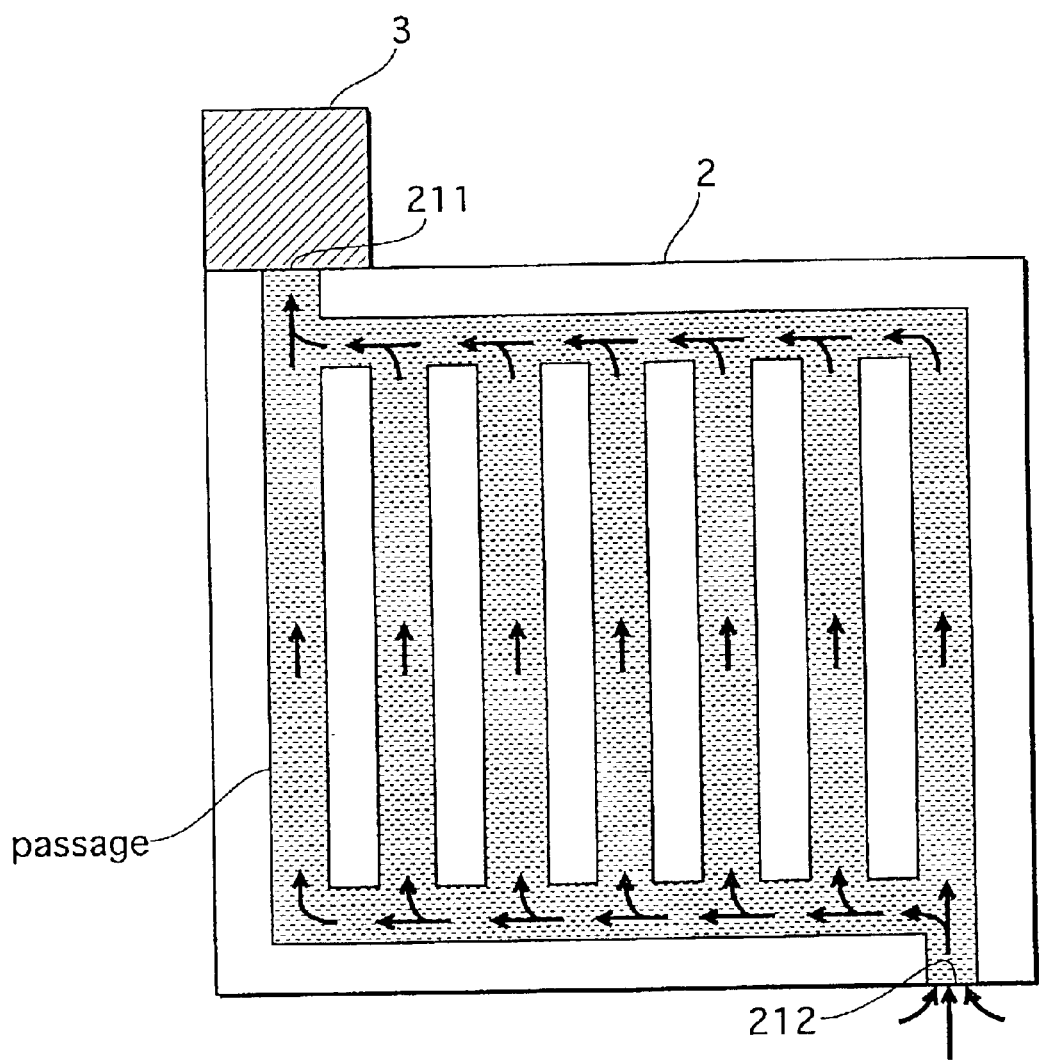
FIG. 4 is a drawing to show the flow of the air going through the passage, which is the space enclosed by the raised area of the LED-mounted substrate 2 and a wall.

FIG. 4 is a drawing to show the flow of the air going through the passage. As shown in FIG. 4, the passage has formation that looks like a ladder, and the air coming in from the opening 212 branches into each part of the passage that looks like steps of a ladder. Then, the air from different parts of the passage gradually merges as getting closer to the opening 211, and finally gets drawn out by the exhauster 3.

[2] Production Method

The following describes the production method of the LED-mounted substrate 2. Since the production method of the exhauster 3 is publicly well-known, the explanation will be omitted.

Figure 5:
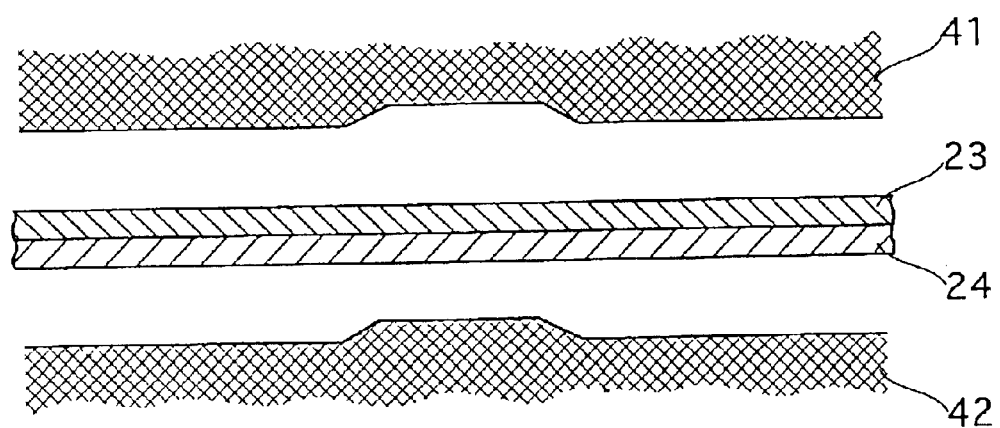
FIG. 5 shows the flexible substrate 24 before being press-formed by the mold 41 and the mold 42.

In order to produce the LED-mounted substrate 2, it is necessary to make molds to form the raised area 21 first. In parallel, the flexible substrate 24 with the Cu pattern 23 formed thereon is produced. Next, the flexible substrate 24 gets pressed with the molds to form the raised area 21 by way of plastic deformation. FIG. 5 shows the flexible substrate 24 before being press-formed by the molds.

The female mold 41 has depressions and the male mold 42 has protrusions to form the raised area 21. The flexible substrate 24 gets pressed with the top surface having the Cu pattern 23 placed against the female mold 41, and with the bottom surface placed against the male mold 42.

After the flexible substrate 24 is press-formed by the molds 41 and 42 to form the raised area 21, LEDs will be placed at the predetermined positions on the Cu pattern 23 using vacuum tweezers and be mounted by soldering. Since the mounting method of the SMD-type LEDs is publicly well-known, detailed explanation will be omitted. Finally, the exhauster 3 will be connected to the LED-mounted substrate 2 produced as above, and the lighting apparatus 1 will be completed.

Second Embodiment

The following describes a lighting apparatus of the second embodiment with reference to the drawings:

Whereas it is designed to remove heat by having air flow through the passage enclosed by the raised area 21 and a wall in the first embodiment, it is designed to remove heat by circulating a cooling gas in a more active manner in the second embodiment. Examples of cooling gases are so-called CFC Substitutes such as HCFC (Hydrochlorofluorocarbon) and HFC (Hydrofluorocarbon).

[1] General Structure

Figure 6:
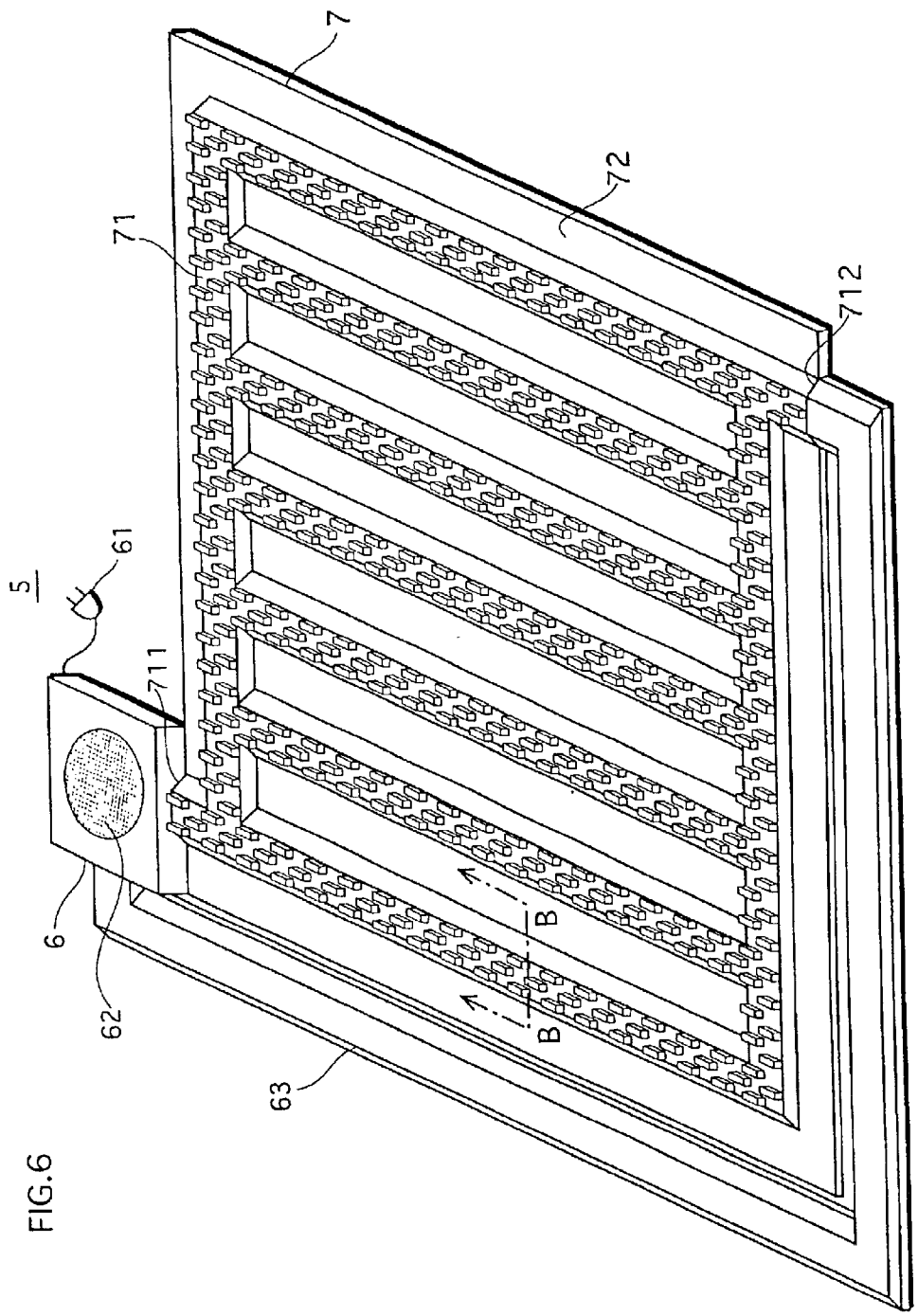
FIG. 6 is a perspective view of the lighting apparatus 5 in the second embodiment of the present invention as seen by looking down on the exterior thereof.

FIG. 6 is a perspective view of the lighting apparatus in the second embodiment as seen by looking down on its exterior. The lighting apparatus 5 comprises an LED-mounted substrate 7 and a heat remover 6. The LED-mounted substrate 7 has a raised area 71 of trapezoidal cross section, and a flat area 72. A large number of LEDs are mounted on the raised area 71 of the LED-mounted substrate 7.

Figure 7:
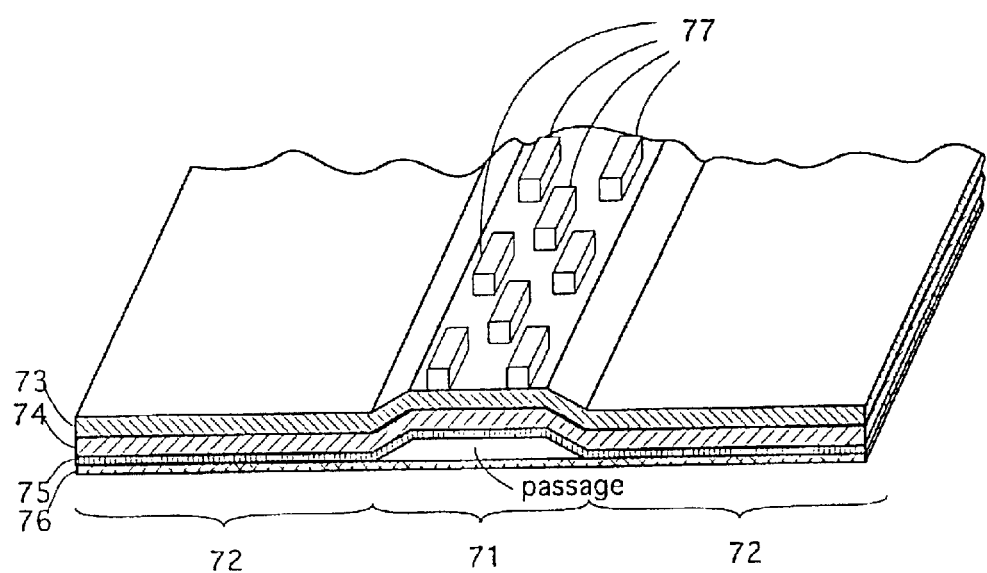
FIG. 7 is a perspective sectional view from the cross section B—B, near the raised area 71 of the LED-mounted substrate 7.

FIG. 7 is a perspective sectional view of the raised area 71 from the cross section B—B. The LED-mounted substrate 7 has a substrate-protecting layer 75 and a cooling gas sealing layer 76 in addition to the LED-mounted substrate 2. The substrate-protecting layer 75 is a layer to protect the flexible substrate 74 from deterioration caused by exposure to a cooling gas, and to prevent the cooling gas from leaking through the flexible substrate 74.

The cooling gas sealing layer 76 is a sealing layer to prevent the cooling gas from leaking toward the wall on which the lighting apparatus 5 will be attached. There is a passage for the cooling gas to go through between the substrate-protecting layer 75 and the cooling gas sealing layer 76 underneath the raised area 71. The substrate-protecting layer 75 and the cooling gas sealing layer 76 are adhered together where they are in contact with each other.

The heat remover 6 is connected to the LED-mounted substrate 7 and circulates the cooling gas in the passage. The heat remover 6 is connected to the LED-mounted substrate 7 at the opening 711, and sends the cooling gas into the passage through the opening 711. The opening 712 and the heat remover 6 are connected by a flue pipe 63. The cooling gas heated while going through the passage flows back to the heat remover 6 via the flue pipe 63.

Inside the heat remover 6 is a heat exchanger (not shown in the drawing) for lowering the temperature of the cooling gas. The air that absorbs the heat from the cooling gas during the cooling process gets exhausted by a fan inside the heat remover 6 via the air vent 62. The air vent 62 is covered with a filter. The heat remover 6 is supplied with electricity from a commercial power supply via the power line 61.

Figure 8:
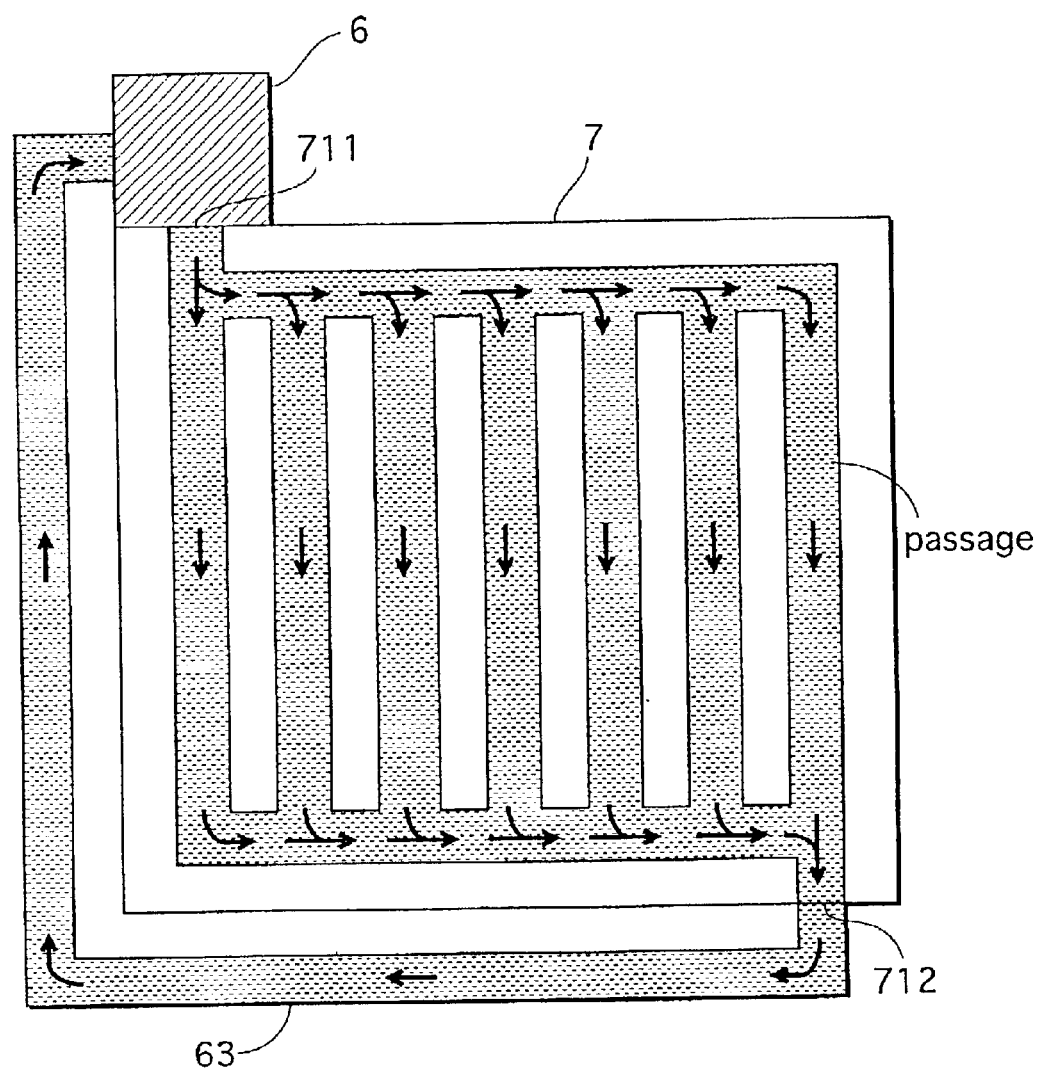
FIG. 8 is a drawing to show the flow of the cooling gas in the passage between the substrate-protecting layer 75 and the cooling gas sealing layer 76.

The cooling gas cooled by the heat remover 6 down to a predetermined temperature goes back into the passage of the LED-mounted substrate 7 via the opening 711. FIG. 8 shows the flow of the cooling gas in the passage. The heat remover 6 sends in the cooling gas via the opening 711. Then, the cooling gas branches into different parts of the passage before it gradually merges again as getting closer to the opening 712, and finally gets drawn out by the heat remover 6 via the flue pipe 63.

[2] Production Method

The following describes the production method of the LED-mounted substrate 7. Since the production method of the heat remover 6 is publicly well-known, the explanation will be omitted.

Like the LED-mounted substrate 2, the LED-mounted substrate 7 is also made from the flexible substrate with a pattern formed thereon. Then, the flexible substrate gets pressed with molds by way of plastic deformation. After LEDs are mounted on the substrate, the substrate-protecting layer 75 and the cooling gas sealing layer 76 are made. More specifically, substrate-protecting layer 75 is a rubber coat with high thermal conductivity made by applying rubber paint on the bottom surface of the flexible substrate. In addition, the cooling gas sealing layer 76 is a rubber sheet made to fit the shape of the LED-mounted substrate 7, and firmly adhered to the substrate-protecting layer 75 in the area beneath the flat area 72 using an adhesive. It should be noted here that the substrate-protecting layer 75 and the cooling gas sealing layer 76 need to be firmly adhered to each other on the edge of the LED-mounted substrate 7 so that the cooling gas does not leak.

On the other hand, it is not necessary to have them firmly adhere to each other in the parts other than the edge. It is acceptable if the cooling gas at least goes through under the raised area 71, because that will allow the cooling gas to remove the heat from LEDs and the objective of this invention will be achieved.

Third Embodiment

It is also desirable to remove the heat from LEDs using a liquid adjusted to be a predetermined temperature. The explanation on the structure and production method for the LED-mounted substrate in this embodiment will be omitted as it is the same as the second embodiment.

Figure 9:
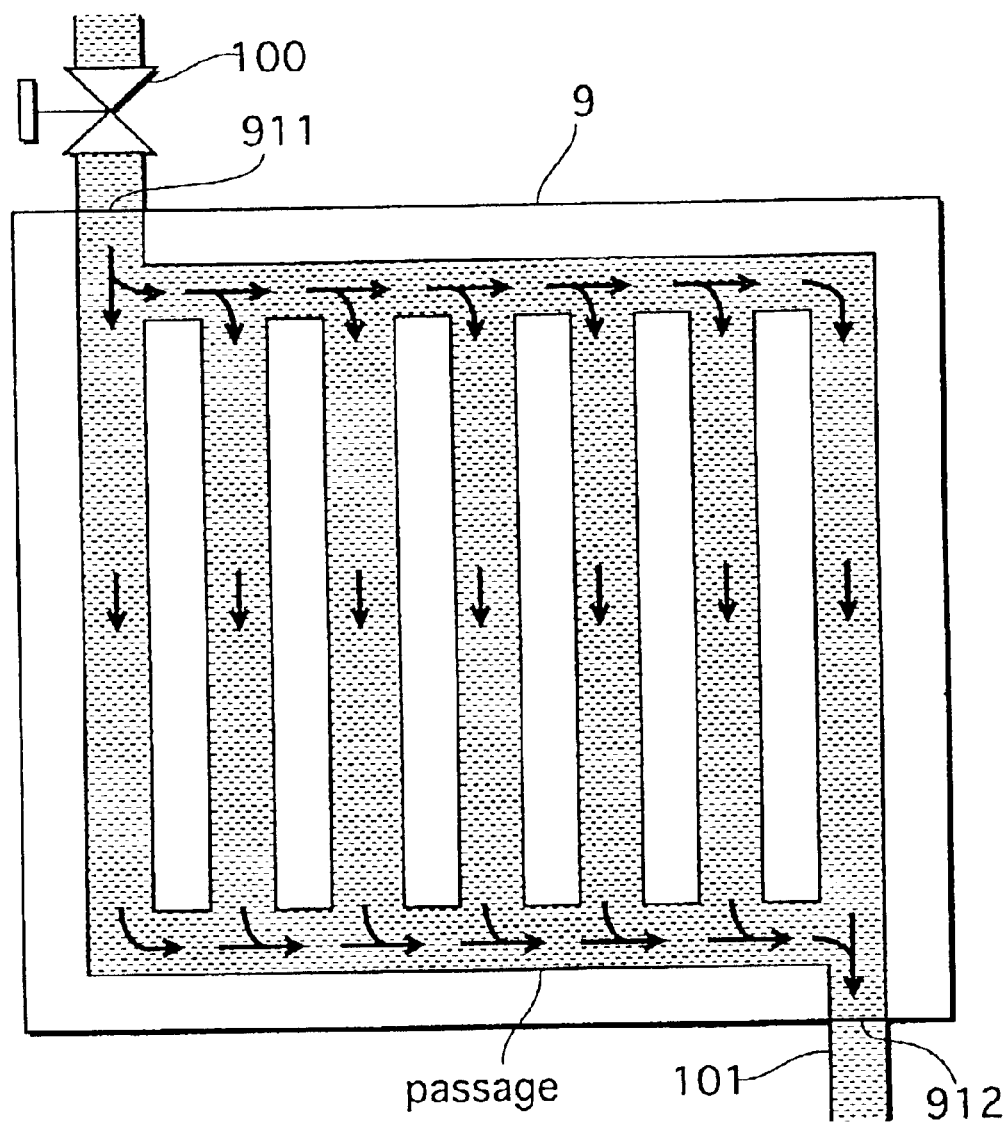
FIG. 9 is a drawing to show the general structure of the lighting apparatus 8 in the third embodiment of the present invention.

FIG. 9 shows the general structure of the lighting apparatus 8 in the third embodiment. In FIG. 9, a valve 100 adjusts the amount of the cooling liquid that flows into the passage of the LED-mounted substrate 9. The cooling liquid goes through the valve 100, flows into the passage from the opening of the passage 911, absorbs the heat from LEDs while it flows through the passage, and flows out from the opening 912. The cooling liquid coming out of the opening 912 will be discharged via a discharge pipe 101.

Modifications

This invention so far has been explained on the basis of the preferred embodiments; however, needless to say, the embodiments of this invention are not limited to the ones mentioned above. The following describes other possible modifications.

(1) The Formation of the Raised Area 21 and the Like

As shown in FIG. 1, in the first through third embodiments, the planar formation of the raised area 21 and the like is in the shape of a ladder; however, it is acceptable to have other kinds of formation that can most efficiently realize heat absorption depending on the alignment of the LEDs. What is important in determining the planar formation of the raised area is to make sure that the cooling fluid such as the air, a cooling gas, and a cooling liquid flows in every part of the passage.

If the cooling fluid does not flow very well at some parts of the passage, the heat from LEDs cannot be removed very efficiently; therefore, it is desirable to keep up the amount of the fluid flowing in all parts of the passage at the level needed for dissipating the heat from LEDs, by even having different amounts of fluid flow in different parts of the passage.

In the aforementioned embodiments, the passage has only one opening from which the cooling fluid goes into the passage (e.g. the opening 212), and only one opening from which the cooling fluid comes out of the passage (e.g. the opening 211). It is acceptable to have more openings of each kind and it is desirable to have as many openings as to ensure that enough amount of fluid flows in the passage for dissipating the heat from LEDs, depending on the planar formation of the raised area.

It is preferable that the raised area 21 and the like is flat at the parts where LEDs are mounted, because if the top of the raised area is curved, that would make it impossible or difficult to mount LEDs on the substrate, and it is not suitable for production.

(2) Types of LEDs

In the aforementioned embodiments, SMD (Surface Mounted Device)-type LEDs are used; however, it is also acceptable to mount bare chip LEDs by wire bonding. An SMD-type LED is produced by putting a bare chip LED into a package; therefore, using bare chip LEDs would naturally allow LEDs to be mounted with high density. If there are more LEDs per area, there will be more heat created per area, too, but the aforementioned invention provides a way to solve the problems caused by heat.

It is also acceptable to mount bare chip LEDs by flip-chip bonding, instead of SMD-type LEDs and bare chip LEDs mounted by wire bonding. Mounting bare chip LEDs by flip-chip bonding also allows LEDs to be mounted with high density because no space is necessary for wires such as Au wires. Mounting LEDs by flip-chip has another benefit that there is no need to consider the height of the wires. Both wire bonding and flip-chip bonding are suitable for embodying the present invention.

(3) Processing the Top Surface of the Led-mounted Substrate

Although it was not mentioned in the preferred embodiments, it is also acceptable to apply white paint on the top surface of the LED-mounted substrate 2, except for where the LEDs are in contact with the substrate, to increase the quantity of light. It is also acceptable to coat the top surface of the LED-mounted substrate to form a protective layer for the purpose of protecting the Cu pattern from erosion and short-circuits due to contact with conductive substances.

(4) Materials for the Flexible Substrate

In the preferred embodiments, it is mentioned that the flexible substrate included in the LED-mounted substrate is made of glass epoxy; however, it is also acceptable that the flexible substrate is made of polyimide resin instead. Also, this invention can be embodied by using other materials than those for the flexible substrate.

(5) Cooling Liquid

Water is an example of the cooling liquid used in the Third Embodiment. It is acceptable to draw up ground water and supply it to the LED-mounted substrate 9 via the valve 100 for cooling down the LED-mounted substrate 9. In this case, it is also acceptable to return the water coming out of the discharge pipe 101 back to the ground, since the water is not contaminated.

Additionally, when choosing another liquid besides water to be used for a cooling liquid, it would be desirable to choose a liquid that has large heat capacity. When the cooling liquid is not water, it would be preferable to circulate the cooling liquid between the LED-mounted substrate and the heat remover like the cooling gas in the second embodiment, rather than taking the cooling liquid to the outside of the lighting apparatus. This way, it is possible to avoid damaging the environment with unnecessary substances.

Moreover, it would be desirable if the temperature of the cooling liquid is close to that of the ambient air. When the temperature of the cooling liquid is too low, there is a possibility of condensation formed on the surface of the substrate, which may cause short circuits and erosion of the substrate to damage the lighting apparatus. Condensation may also bring about molds which could be a cause of discomfort from musty smell and an unsanitary environment inducing allergy. With all these taken into account, it is desirable to have the temperature of the cooling liquid close to that of the ambient air.

(6) A Substrate-protecting Layer and a Cooling Gas Sealing Layer

In the second embodiment, it is mentioned that the substrate-protecting layer 75 and the cooling gas sealing layer 76 are made of rubber. But it is possible to use other materials besides rubber as long as leakage of the cooling gas and liquid can be prevented, although the materials need to be chosen carefully so that the substrate-protecting layer and the cooling gas sealing layer do not get melted by the adhesive used to attach them together.

It is also acceptable to attach the substrate-protecting layer and the cooling gas sealing layer together by applying heat and pressure instead of an adhesive. The effects of the present invention will be available even with other methods of attaching those layers together.

(7) Light Emitting Bodies

In the preferred embodiments, LEDs are used as light emitting bodies in the lighting apparatus 1 and the like; however, the effects of the present invention would be available even by using other light emitting bodies besides LEDs, e.g. organic electroluminescence devices, as long as a fluid such as a cooling gas can conduct the heat from the light emitting bodies.

Additionally, it is also acceptable to use a combination of kinds of LEDs with different light source colors. The effects of the present invention would be available regardless of the types of the LEDs or how many different types of LEDs are used.

(8) Passages

In the preferred embodiments, two cases have been presented such as (1) the air flows through the passage enclosed by the raised area of the flexible substrate 24 and the wall and (2) a cooling gas or liquid flows through the passage formed between the substrate-protecting layer 75 and the cooling gas sealing layer 76.

Figure 10:
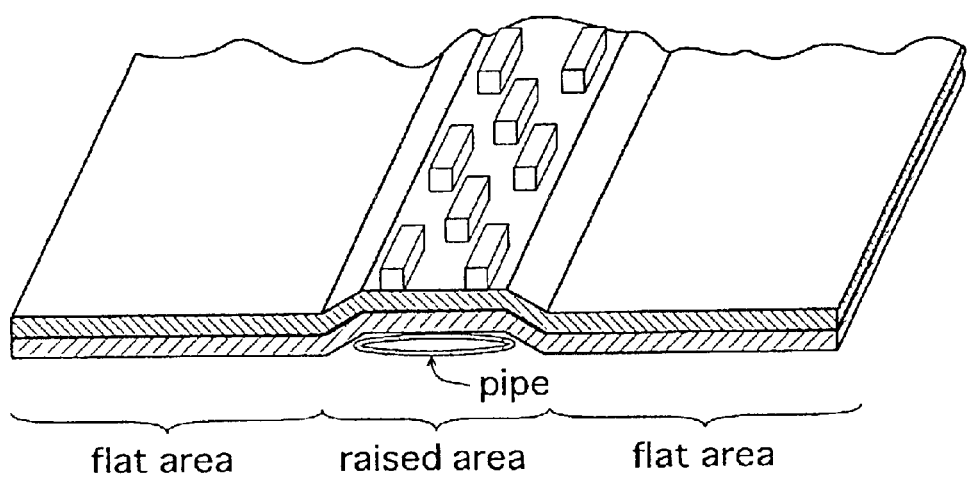
FIG. 10 is a perspective sectional view of an LED-mounted substrate with a pipe disposed inside the passage, which corresponds to FIG. 2 and FIG. 7.

Besides those cases, it is also acceptable that a cooling gas and the like flows through a pipe disposed in each passage. The material used for the pipes may be vinyl and such, and it is desirable to choose a material that is not easily deteriorated by the fluid flowing inside. FIG. 10 is a perspective sectional view of an LED-mounted substrate with a pipe disposed inside the passage, which corresponds to FIG. 2 and FIG. 7. As shown in FIG. 10, the pipe is disposed to fit in the raised area.

The pipes may be adhered to the LED-mounted substrate with an adhesive or may be just inserted between the wall and the raised area. It is to be noted that the pipes are disposed in such a manner that the pipes and the LED-mounted substrate are in contact with each other as much as possible so that the heat from LEDs can be most efficiently conducted by the fluid that flows in the pipe.

So far the heat carried by a fluid such as the air was supposed to be disposed of at the end; however, it is also acceptable to collect and reuse the heat. Especially, when the lighting apparatus is a large one, the heat can be reused with high efficiency. For example, outdoor advertisement lights are usually turned on only during the nighttime when the atmospheric temperature is lower than the daytime; therefore, there will be a big difference in the temperature between the ambient air and the fluid carrying the heat, and the heat can be used very efficiently.

(9) Positioning of LEDs

Figure 11:
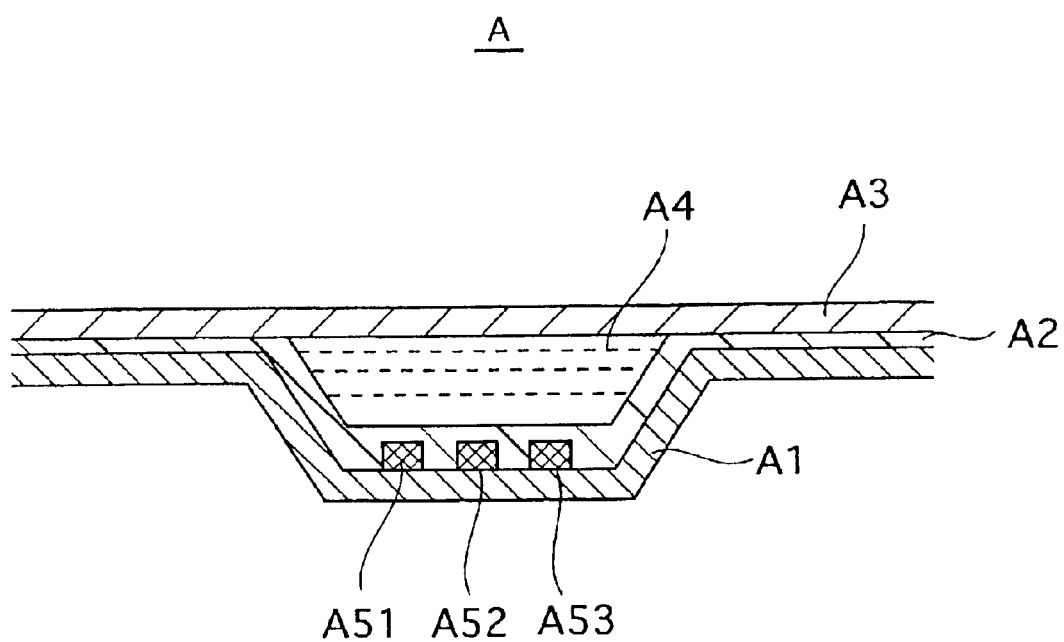
FIG. 11 is a sectional view of an LED-mounted substrate wherein LEDs are mounted on the fluid-flowing surface of the substrate.

In the above-mentioned embodiments, there is a passage through which a cooling fluid flows, and LEDs are mounted on the different surface of the substrate than the fluid-flowing surface; however it is also acceptable to mount the LEDs on the same surface as the fluid-flowing surface. FIG. 11 is a sectional view of an LED-mounted substrate wherein LEDs are mounted on the fluid-flowing surface of the substrate.

As shown in FIG. 11, in the LED lighting apparatus A, LEDs A51, A52, and A53 are mounted at the bottom of the depressed area of the LED-mounted substrate A1. The LED-mounted substrate A1 has a protective layer A2 on the same surface as the one on which the LEDs A51, A52, and A53 are mounted. The protective layer A2 is made of a translucent material so that the light emitted by the LEDs A51, A52, and A53 passes through with little loss. The protective layer A2 also has high heat conductivity.

A translucent board A3 is partially adhered to the protective layer A2. The translucent board A3 is also made of a translucent material so that the light emitted by the LEDs A51, A52, and A53 passes through with little loss. The translucent board A3 and the protective layer A2 are not adhered together at the depressed area of the LED-mounted substrate A1; therefore, there is a space A4 left between the translucent board A3 and the protective layer A2.

A cooling fluid flows inside the space A4 to remove the heat from the LEDs A51, A52, and A53 conducted via the protective layer A2, and to cool down the LED-mounted substrate Al. This way, it is possible to remove heat efficiently by applying the present invention even when LEDs are mounted on the fluid-flowing surface of the substrate.

Additionally, it is acceptable to apply mirror-processing to the depressed area of the LED-mounted substrate Al for the purpose of improving the luminous efficacy of the whole LED lighting apparatus A.

Furthermore, it is also acceptable to apply lens-processing to the translucent board A3 at over the depressed area. This way it is possible to adjust the luminous intensity distribution of the LED lighting apparatus A. Besides, it is also acceptable to color the depressed area of the LED-mounted substrate Al and the translucent board A3 for the purpose of adjusting the light source color of the LED lighting apparatus A.

CONCLUSION

As discussed above, the present invention makes it possible to remove heat from LEDs efficiently by forming an LED-mounted substrate to have a passage and cause a cooling fluid to flow through the passage. With this construction, it is possible to avoid increasing the size and weight of the lighting apparatus for improving the cooling function because no cooling members such as a radiator board are necessary.

The construction presented makes it possible to have a larger advertisement billboard because the present invention is effective in removing heat from LEDs even in a large LED lighting apparatus such as the one for an outdoor advertisement billboard and also because the weight of the lighting apparatus imposed on the foundation of the lighting apparatus is much reduced.

Also, it is possible to have a larger lighting apparatus indoors because the weight of the lighting apparatus imposed on a wall or a ceiling is much reduced. Consequently, when the size of a lighting apparatus is large, there would be enough quantity of light as a whole apparatus, and it is not necessary that the quantity of light of each individual LED is very high; therefore, it is possible to reduce the costs of the lighting apparatus by using less expensive LEDs.

Needless to say, dispensing with a cooling board according to the present invention would reduce the cost of an LED lighting apparatus as well as keeping its size and weight down. In conclusion, the LED lighting apparatuses will be more widely used, and the lighting situations will be improved at both indoor and outdoor locations as well as at home and in the offices.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A lighting apparatus comprising a substrate and light emitting bodies mounted on a main surface of the substrate, wherein
    one or more areas of the substrate are raised to each form a passage thereunder through which a fluid flows to remove heat from the light emitting bodies, and
    the light emitting bodies are mounted on the one or more raised areas, wherein the passages each have a pipe therein through which the fluid flows.

2. A lighting apparatus of claim 1, wherein
    the substrate is made of a material that is deformable by plastic deformation, and
    the raised areas are formed by plastic deformation.

3. A lighting apparatus of claim 1, wherein
    the light emitting bodies are LEDs.

4. A lighting apparatus of claim 3, wherein
    the LEDs are bare chip LEDs.

5. The lighting apparatus of claim 1, wherein
    the fluid is directed into the passage at a substantially ambient temperature.

6. The lighting apparatus of claim 1, wherein
    the fluid is air.

7. The lighting apparatus of claim 6, wherein
    the passages are connected to an exhausting device and have an opening from which an ambient air is drawn into the passages.

8. The lighting apparatus of claim 1, wherein
    the raised areas join with each other to form a single continuous passage.

9. The lighting apparatus of claim 1 further comprising
    a protective layer to keep the substrate out of contact with the fluid.

10. A lighting apparatus comprising:
    an integral one-piece substrate having a top plurality of elongated raised areas;
    an electrically conductive pattern on each of the elongated raised areas; and
    a plurality of light emitting diodes connected to the electrically conductive pattern on each of the elongated raised areas, to provide a connection for powering the light emitting diodes,
    the integral substrate having a bottom plurality of flat areas offset from the top plurality of elongated raised areas and positioned within a plane wherein mounting of the flat areas on a support surface enables the surfaces between the flat areas to define heat conducting flow channels for dissipating heat from activated light emitting diodes mounted above each heat conducting flow channel.

11. The lighting apparatus of claim 10 wherein at least a predetermined number of the flat areas have an adhesive for attachment to the support surface.

12. The lighting apparatus of claim 10 further including a rubber sheet attached to the flat areas and defining the heat conducting flow channels between the flat areas.

13. The lighting apparatus of claim 10 further including a source of cooling fluid and a valve member for regulating the flow of the cooling fluid through the heat conducting flow channels.

14. The lighting apparatus of claim 10 wherein the heat conducting flow channels each have a pipe therein through which a fluid flows.

15. A lighting apparatus comprising:
    an integral one-piece substrate having a top plurality of elongated raised areas;
    an electrically conductive pattern on each of the elongated raised areas;
    a plurality of light emitting diodes connected to the electrically conductive pattern on each of the elongated raised areas, to provide a connection for powering the light emitting diodes,
    the integral substrate having a bottom plurality of flat areas offset from the top plurality of elongated raised areas and positioned within a plane wherein mounting of the flat areas on a support surface enables the surfaces between the flat areas to define heat conducting flow channels for dissipating heat from activated light emitting diodes mounted above each heat conducting flow channel; and
    a valve member for regulating flow through the heat conducting flow channels.

16. The lighting apparatus of claim 15 wherein at least a predetermined number of the flat areas have an adhesive for attachment to the support surface.

17. The lighting apparatus of claim 15 further including a rubber sheet attached to the flat areas and defining the heat conducting flow channels between the flat areas.

18. The lighting apparatus of claim 15 further including a source of cooling fluid.

19. The lighting apparatus of claim 15 wherein the heat conducting flow channels each have a pipe therein through which a fluid flows.

* * * * *